US007163734B2

(12) United States Patent
Anderson et al.

(10) Patent No.: US 7,163,734 B2
(45) Date of Patent: Jan. 16, 2007

(54) PATTERNING OF ELECTRICALLY CONDUCTIVE LAYERS BY INK PRINTING METHODS

(75) Inventors: Charles C. Anderson, Penfield, NY (US); Mitchell S. Burberry, Webster, NY (US); Mark Lelental, Rochester, NY (US); Yongcai Wang, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/648,420

(22) Filed: Aug. 26, 2003

(65) Prior Publication Data

US 2005/0048228 A1 Mar. 3, 2005

(51) Int. Cl.
| B32B 3/10 | (2006.01) |
| B32B 27/06 | (2006.01) |
| B32B 27/16 | (2006.01) |
| B32B 27/30 | (2006.01) |
| B32B 27/32 | (2006.01) |
| B32B 27/36 | (2006.01) |
| B32B 27/38 | (2006.01) |
| B32B 27/40 | (2006.01) |

(52) U.S. Cl. .......... 428/195.1; 428/210; 428/211.1; 428/341; 428/411.1; 428/412; 428/413; 428/423.1; 428/480; 428/500; 428/522; 428/523; 428/532; 428/537.5

(58) Field of Classification Search .......... 252/500, 428/341, 411.1, 412, 413, 423.1, 446, 480, 428/500, 522, 523, 532, 537.5, 195, 210, 428/211, 195.1

See application file for complete search history.

(56) References Cited

U.S. PATENT DOCUMENTS

| 4,070,189 A | 1/1978 | Kelley et al. ............... 430/527 |
| 4,731,408 A | 3/1988 | Jasne ........................ 524/458 |
| 4,987,042 A | 1/1991 | Jonas et al. ................ 429/213 |
| 5,093,439 A | 3/1992 | Epstein et al. ............. 525/540 |
| 5,300,575 A | 4/1994 | Jonas et al. ................ 525/186 |
| 5,312,681 A | 5/1994 | Muys et al. ................ 428/323 |
| 5,354,613 A | 10/1994 | Quintens et al. ........... 428/341 |
| 5,370,981 A | 12/1994 | Krafft et al. ............... 430/529 |
| 5,372,924 A | 12/1994 | Quintens et al. ........... 430/527 |
| 5,391,472 A | 2/1995 | Muys et al. ................ 430/527 |
| 5,403,467 A | 4/1995 | Jonas et al. ................ 205/125 |
| 5,443,944 A | 8/1995 | Krafft et al. ............... 430/527 |
| 5,561,030 A | 10/1996 | Holdcroft et al. .......... 430/311 |
| 5,575,898 A | 11/1996 | Wolf et al. ................ 205/125 |
| 5,665,498 A | 9/1997 | Savage et al. .............. 430/41 |
| 5,674,654 A | 10/1997 | Zumbulyadis et al. ...... 430/41 |
| 5,716,550 A | 2/1998 | Gardner et al. ............ 252/500 |
| 5,766,515 A * | 6/1998 | Jonas et al. ................ 252/500 |
| 5,976,274 A | 11/1999 | Inoue et al. ............... 148/304 |
| 6,045,977 A | 4/2000 | Chandross et al. ......... 430/311 |
| 2002/0158295 A1 | 10/2002 | Armgarth et al. |
| 2003/0008247 A1* | 1/2003 | Lelental et al. ............ 430/517 |
| 2004/0048048 A1* | 3/2004 | Lamotte et al. ........... 428/195.1 |

FOREIGN PATENT DOCUMENTS

| EP | 0 686 662 | 4/1995 |
| EP | 686662 A2 * | 12/1995 |
| EP | 440 957 A | 3/1996 |
| EP | 615 256 A | 9/1998 |
| EP | 1 003 179 | 5/2000 |
| EP | 1 079 397 A1 | 2/2001 |
| EP | 686 662 A | 11/2002 |
| EP | 1 054 414 A | 3/2003 |
| WO | WO 01/20691 | 3/2001 |
| WO | WO 03/067333 | 8/2003 |
| WO | WO 03/067680 | 8/2003 |

OTHER PUBLICATIONS

Derwent abstract 1995-383921, abstract of EP 686,662 A2 and US 5,766,515, Dec. 1995.*
Co-pending U.S. Appl. No. 10/648,418, Lelental et al., Electrographic Patterning of Conductive Electrode Layers Conatining Electrically Conductive Polymeric Materials (D-83943).
Co-pending U.S. Appl. No. 10/648,419, Lelental et al.; Photopatterning of Conductive Electrode Layers Containing Electrically-Conductive Polymer Particles (D-83892).
Co-pending U.S. Appl. No. 10/648,421, Burberry et al., Method of Patterning an Electroconductive Layer on a Support (D-84232).

* cited by examiner

Primary Examiner—Ramsey Zacharia
(74) Attorney, Agent, or Firm—Paul A. Leipold; Doreen Wells

(57) ABSTRACT

An element comprising a support on which is disposed an organic electroconductive polymeric layer containing a conductive polymer such that when a printing solution containing a conductivity enhancing agent contacts said electroconductive layer, the resistivity of the areas that are contacted with a printing solution decreases by at least a factor of 10. A method for producing an electrode pattern in the substrate is also disclosed.

33 Claims, No Drawings

PATTERNING OF ELECTRICALLY CONDUCTIVE LAYERS BY INK PRINTING METHODS

CROSS-REFERENCE TO RELATED APPLICATIONS

This application relates to commonly assigned copending application Ser. No. 10/648,419 entitled PHOTOPATTERNING OF CONDUCTIVE ELECTRODE LAYERS CONTAINING ELECTRICALLY-CONTAINING POLYMER PARTICLES, application Ser. No. 10/648,418 entitled ELECTROGRAPHIC PATTERNING OF CONDUCTIVE ELECTRODE LAYERS CONTAINING ELECTRICALLY-CONDUCTIVE POLYMERIC MATERIALS, application Ser. No. 10/648,421 entitled METHOD OF PATTERNING AN ELECTROCONDUCTIVE LAYER ON A SUPPORT, filed simultaneously herewith. The copending applications are incorporated by reference herein for all that they contain.

FIELD OF THE INVENTION

The present invention relates to an element and a method for patterning an organic polymer electroconductive layer that is suitable as an electronic circuitry element in an electric or semiconductor device.

BACKGROUND OF THE INVENTION

Transparent electrically-conductive layers (TCL) of metal oxides such as indium tin oxide (ITO), antimony doped tin oxide, and cadmium stannate (cadmium tin oxide) are commonly used in the manufacture of electrooptical display devices such as liquid crystal display devices (LCDs), electroluminescent display devices, photocells, solid-state image sensors or electrochromic windows.

Devices such as flat panel displays, typically contain a substrate provided with an indium tin oxide (ITO) layer as a transparent electrode. The coating of ITO is carried out by vacuum sputtering methods which involve high substrate temperature conditions up to 250° C., and therefore, glass substrates are generally used. The high cost of the fabrication methods and the low flexibility of such electrodes, due to the brittleness of the inorganic ITO layer as well as the glass substrate, limit the range of potential applications. As a result, there is a growing interest in making all-organic devices, comprising plastic resins as a flexible substrate and organic electroconductive polymer layers as an electrode. Such plastic electronics allow low cost devices with new properties. Flexible plastic substrates can be provided with an electroconductive polymer layer by continuous hopper or roller coating methods (compared to batch process such as sputtering) and the resulting organic electrodes enable the "roll to roll" fabrication of electronic devices which are more flexible, lower cost, and lower weight.

Intrinsically conductive polymers have recently received attention from various industries because of their electronic conductivity. Although many of these polymers are highly colored and are less suited for TCL applications, some of these intrinsically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are transparent and not prohibitively colored, at least when coated in thin layers at moderate coverage. Because of their electronic conductivity instead of ionic conductivity, these polymers are conducting even at low humidity.

EP-A-440 957 describes a method for preparing polythiophene in an aqueous mixture by oxidative polymerization in the presence of a polyanion as a doping agent. In EP-A-686 662 it has been disclosed that highly conductive layers of polythiophene, coated from an aqueous coating solution, could be made by the addition of a di- or polyhydroxy and/or a carbonic acid, amide or lactam group containing compound in the coating solution of the polythiophene. Coated layers of organic electroconductive polymers can be patterned into electrode arrays using different methods. The known wet-etching microlithography technique is described in WO97/18944 and U.S. Pat. No. 5,976,274 wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. In U.S. Pat. No. 5,561,030 a similar method is used to form the pattern except that the pattern is formed in a continuous layer of prepolymer which is not yet conductive and that after washing the mask away the remaining prepolymer is rendered conductive by oxidation. Such methods that involve conventional lithographic techniques are cumbersome as they involve many steps and require the use of hazardous chemicals.

EP-A-615 256 describes a method to produce a pattern of a conductive polymer on a substrate that involves coating and drying a composition containing 3,4-ethylenedioxythiophene monomer, an oxidation agent, and a base; exposing the dried layer to UV radiation through a mask; and then heating. The UV exposed areas of the coating comprise non-conductive polymer and the unexposed areas comprise conductive polymer. The formation of a conductive polymer pattern in accordance with this method does not require the coating and patterning of a separate photoresist layer.

U.S. Pat. No. 6,045,977 describes a process for patterning conductive polyaniline layers containing a photobase generator. UV exposure of such layers produces a base that reduces the conductivity in the exposed areas.

EP-A-1 054 414 describes a method to pattern a conductive polymer layer by printing an electrode pattern onto said conductive polymer layer using a printing solution containing an oxidant selected from the group $ClO^-$, $BrO^-$, $MnO_4^-$, $Cr_2O_7^{-2}$, $S_2O_8^{-2}$, and $H_2O_2$. The areas of the conductive layer exposed to the oxidant solution are rendered nonconductive.

Research Disclosure, November 1998, page 1473 (disclosure no. 41548) describes various means to form patterns in conducting polymer, including photoablation wherein the selected areas are removed from the substrate by laser irradiation. Such photoablation processes are convenient, dry, one-step methods but the generation of debris may require a wet cleaning step and may contaminate the optics and mechanics of the laser device. Prior art methods involving removal of the electroconductive polymer to form the electrode pattern also induce a difference of the optical density between electroconductive and non-conductive areas of the patterned surface, which should be avoided.

Methods of patterning organic electroconductive polymer layers by image-wise heating by means of a laser have been disclosed in EP 1 079 397 A1. That method induces about a 10 to 1000 fold decrease in resistivity without substantially ablating or destroying the layer.

As indicated herein above, the art discloses a wide variety of electrically conductive TCL compositions. However, there is still a critical need in the art for patterned conductive TCL structures. In addition to providing superior electrode performance, the TCL layers also must be highly transparent, must be patternable, must resist the effects of humidity change, and be manufacturable at a reasonable cost.

It is toward the objective of providing such improved electrically conductive, patternable, preferably web coatable, TCL films that more effectively meet the diverse commercial needs than those of the prior art that the present invention is directed.

SUMMARY OF THE INVENTION

It is an object of the present invention to provide a convenient, one-step method of patterning an electroconductive organic polymer layer that does not require the use of conventional lithographic techniques or removal of areas of the conductive coating by etching or ablation. The objects of the invention are realized by providing a method for producing an electrode pattern in a conductive polymer disposed on a substrate, the method comprising the steps of:
applying a layer containing a conductive polymer on a substrate; and
printing a pattern on said layer using a printing solution containing a conductivity enhancing agent such that the resistivity of the areas that are contacted with the printing solution decreases by at least a factor of 10.

The invention also provides an element comprising a support on which is disposed an electroconductive polymeric layer containing a conductive polymer such that when a solution containing a conductivity enhancing agent contacts said electroconductive layer, the resistivity of the areas that are contacted decreases by at least a factor of 10.

Said conductivity enhancing agent includes organic compounds containing dihydroxy or poly-hydroxy and/or carboxyl groups or amide groups or lactam groups.

DETAILED DESCRIPTION OF THE INVENTION

The method in accordance with the present invention involves the coating and subsequent drying of a coating composition containing an intrinsically conductive polymer on a substrate followed by printing an electrode pattern on the dried layer using a printing solution containing a conductivity enhancing agent.

The intrinsically conductive polymers can be chosen from any or a combination of known intrinsically conductive polymers, such as substituted or unsubstituted pyrrole-containing polymers (as mentioned for example, in U.S. Pat. Nos. 5,665,498 and 5,674,654), substituted or unsubstituted thiophene-containing polymers (as mentioned for example, in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408), and substituted or unsubstituted aniline-containing polymers (as mentioned for example, in U.S. Pat. Nos. 5,716,550, 5,093,439, and 4,070,189).

The conductive layer of the invention should contain about 10 to about 1000 mg/m$^2$ dry coating weight of the intrinsically conductive polymer. Preferably, the conductive layer should contain about 20 to about 500 mg/m$^2$ dry coating weight of the intrinsically conductive polymer. The actual dry coating weight of the conductive polymer applied is determined by the properties for the particular conductive polymer employed and by the requirements for the particular application, the requirements may include, for example, the conductivity, transparency, optical density, cost, etc for the layer.

In a preferred embodiment, the layer containing the intrinsically conductive polymer is prepared by applying a mixture containing:

a) a polythiophene according to Formula I

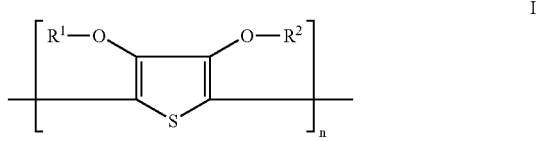

wherein each of R1 and R2 independently represents hydrogen or a C1–4 alkyl group or together represent an optionally substituted C1–4 alkylene group or a cycloalkylene group, preferably an ethylene group, an optionally alkyl-substituted methylene group, an optionally C1–12 alkyl- or phenyl-substituted 1,2-ethylene group, a 1,3-propylene group or a 1,2-cyclohexylene group; and n is 5 to 1000;

b) a polyanion compound; and, optionally c) a film forming polymeric binder.

The intrinsically conductive polymers may be soluble or dispersible in organic solvents or water or mixtures thereof. For environmental reasons, aqueous systems are preferred. Polyanions used with these intrinsically conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electrically conducting polymers and polyanions, mixtures of alkali salts of polyacids and appropriate amounts of monoacids may also be used.

While the intrinsically conductive polymer can be applied without the addition of a film-forming polymeric binder, preferably, a film-forming binder is employed to improve the physical properties of the layer and/or to improve the absorption of the printing solution. In such a preferred embodiment, the layer may comprise from about 5 to 95% of the film-forming polymeric binder. The optimum weight percent of the film-forming polymer binder varies depending on the electrical properties of the intrinsically conductive polymer, the chemical composition of the polymeric binder, and the requirements for the particular circuit application.

Polymeric film-forming binders useful in the conductive layer of this invention can include, but are not limited to, water-soluble or water-dispersible hydrophilic polymers such as gelatin, gelatin derivatives, maleic acid or maleic anhydride copolymers, cellulose derivatives (such as carboxymethyl cellulose, hydroxyethyl cellulose, cellulose acetate butyrate, diacetyl cellulose, and triacetyl cellulose), polyvinyl alcohol, and poly-N-vinylpyrrolidone. Other suitable binders include aqueous emulsions of addition-type homopolymers and copolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes or polyesterionomers.

When employing aqueous printing solutions for the purpose of the present invention it is advantageous to utilize hydrophilic film-forming polymeric binders such as gelatin, gelatin derivatives, cellulose derivatives, or polyvinyl alcohol.

Other ingredients that may be included in the layer containing the intrinsically conductive polymer include but are not limited to antiblocking agents, surfactants or coating aids, thickeners or viscosity modifiers, hardeners or crosslinking agents, pigments or dyes, lubricating agents, and various other conventional coating additives readily apparent to one skilled in the art.

The printing of the electrode pattern can proceed by offset printing, screen-printing or ink-jet printing. The use of ink-jet printing has the advantages that no screens or lithoplates are necessary, ink-jet printers are widely available (including wide format ink-jet printers), and the electrode layout can be designed and output directly from the computer to the printer.

The printing solution used to form the electrode pattern in the present invention contains a conductivity enhancing agent in aqueous or organic solvent medium. For environmental reasons, aqueous printing solutions are most desirable.

Particularly preferred conductivity enhancing agents are: sugar and sugar derivatives such as sucrose, glucose, fructose, lactose; sugar alcohols such as -furancarboxylic acid; alcohols such as ethylene glycol, glycerol, di- or triethylene glycol.

Organic compounds containing dihydroxy, poly-hydroxy, carboxyl, amide, or lactam groups is:

(a) represented by the following Formula II:

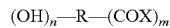

$$(OH)_n-R-(COX)_m \qquad \text{II}$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (b) a sugar, sugar derivative, polyalkylene glycol, or glycerol compound; or (c) selected from the group consisting of N-methylpyrrolidone, pyrrolidone, caprolactam, N-methyl caprolactam, or N-octylpyrrolidone.

The concentration of the conductivity enhancing agent in the printing solution may vary widely depending on the particular organic compound used and the conductivity requirements for the electrode pattern. However, convenient concentrations that may be effectively employed in the practice of the present invention are about 0.5 to about 25 weight %; more conveniently 0.5 to 10 and more desirably 0.5 to 5.

After printing the electrode pattern the layer may be dried at temperatures ranging from room temperature to about 250° C.

After printing and drying, the resistivity of the areas that were contacted with the printing solution decreases by at least a factor of 10, preferably by at least a factor of 100, and most preferably by at least a factor of 1000.

Other components in addition to the conductivity enhancing agent that may be used in the printing solution include: surfactants and wetting aids, rheology modifiers, stabilizers, biocides, humectants and antidrying agents, etc. Dyes and pigments may be used in the printing solution when it is desirable to provide a visual record of the printed electrode pattern.

The layer containing the intrinsically conductive polymer may be applied onto a variety of different substrates depending on the intended use. Suitable substrates include; glass, polymeric films such as polyester, polycarbonate, polystyrene, cellulose esters, polyolefins, and other well known polymer films, paper, silicon wafers, glass reinforced epoxy, etc. The substrates may be transparent, opaque, or reflective. The conductive layer may be applied using any suitable coating method such as spin coating, hopper coating, roller coating, air knife coating, etc.

The invention is further described by the following non-limiting examples.

EXAMPLES

Preparation of Layer Containing Intrinsically Conductive Polymer (Sample A):

An aqueous coating composition containing a commercially available conductive polymer dispersion (Baytron P, which is poly(ethylenedioxythiophene) having a polystyrenesulfonate polyanion, available from Bayer Corporation), gelatin, and a gelatin hardener (dihydroxy dioxane) was applied onto a 100 μm thick polyester substrate and dried at 100° C. The dried coating contained 150 mg/m$^2$ Baytron P, 37.5 mg/m$^2$ gelatin, and 1.2 mg/m$^2$ dihydroxy dioxane and had a surface resistivity as measured with a 2-point probe equal to 1×10$^6$ Ω.

Example 1 (Ink-Jet Printing)

On the layer described above in Sample A an aqueous printing solution containing 3.75 weight % diethylene glycol, 1.25 weight % glycerol, and 0.01 weight % of a nonionic surfactant was applied at a wet coating coverage equivalent to 10 cc/m$^2$ using a Hewlett-Packard DeskJet 692C ink-jet printer. The printing solution was applied onto a 1 inch square area and then the sample was dried at room temperature. The surface resistivity of the treated area after drying was 920 Ω, this represents a decrease in resistivity of more than a factor of 1000.

Example 2 (Lithoplate Printing)

A lithoplate having a 1 inch square "ink-receptive" area was prepared and used to transfer an aqueous printing solution containing 5 weight % diethylene glycol and 0.03 weight % of a nonionic surfactant onto the layer prepared in Sample A. The wet coverage of the printing solution applied was equivalent to 12.5 cc/m$^2$. After printing the sample was dried at room temperature. The surface resistivity of the treated area after drying was 1×10$^3$ Ω, this represents a 1000 fold decrease in resistivity.

What is claimed is:

1. An element comprising a support on which is disposed an organic electroconductive polymeric layer containing a conductive polymer having a resistivity of $1 \times 10^6$ Ω or less and a pattern of a printing solution containing a conductivity enhancing agent in contact with said electroconductive layer, such that the resistivity of the areas that are contacted with the pattern of printing solution decreases by at least a factor of 1000.

2. The element of claim 1 wherein the conductivity enhancing agent is an organic compound containing dihydroxy, poly-hydroxy, carboxyl, amide, or lactam groups.

3. The element of claim 2 wherein the organic compound containing dihydroxy, poly-hydroxy, carboxyl, amide, or lactam groups is:
   (a) represented by the following Formula II:

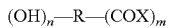

$(OH)_n—R—(COX)_m$  II wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or
   (b) a sugar, sugar derivative, polyalkylene glycol, or glycerol compound; or
   (c) selected from the group consisting of N-methylpyrrolidone, pyrrolidone, caprolactam, N-methyl caprolactam, or N-octylpyrrolidone.

4. The element of claim 3, wherein n and m independently of one another denote an integer from 2 to 8.

5. The element of claim 3 wherein the conductivity enhancing agent is sucrose, glucose, fructose, lactose, sorbitol, mannitol, 2-furancarboxylic acid, 3-furancarboxylic acid, ethylene glycol, glycerol, di- or triethylene glycol.

6. The element of claim 2 wherein the organic compound containing lactam groups is N-methylpyrrolidone, pyrrolidone, caprolactam, N-methylcaprolactam, or N-octylpyrrolidone.

7. The element of claim 1 wherein said conductivity enhancing agent is a N-methylpyrrolidone, pyrrolidone, caprolactam, N-methylcaprolactam, N-octylpyrrolidone, sucrose, glucose, fructose, lactose, sugar alcohol, 2-furan carboxylic acid, 3-furan carboxylic acid, sorbitol, glycol, ethylene glycol, glycerol, diethylene glycol, or triethylene glycol, or a mixture of any two or more of these compounds.

8. The element of claim 1 wherein said conductivity enhancing agent is N-methylpyrrolidone, pyrrolidone, caprolactam, N-methyl caprolactam, or N-octylpyrrolidone.

9. The element of claim 1 wherein said conductivity enhancing agent is ethylene glycol, diethylene glycol or glycerol.

10. The element of claim 1 wherein said conductivity enhancing agent is one or more than one compound selected from the group consisting of N-methylpyrrolidone, sorbitol, ethylene glycol, glycerol, and diethylene glycol.

11. The element of claim 1 wherein the concentration of conductivity enhancing agent in the printing solution is 0.5 to 25.0 wt %, based on the weight of the printing solution.

12. The element of claim 1 wherein the concentration of conductivity enhancing agent in the printing solution is 0.5 to 10.0 wt %, based on the weight of the printing solution.

13. The element of claim 1 wherein the concentration of conductivity enhancing agent in the printing solution is 0.5 to 5.0 wt %, based on the weight of the printing solution.

14. The element of claim 1 wherein the conductive polymer is a substituted or unsubstituted pyrrole-containing polymer, a substituted or unsubstituted thiophene-containing polymer, or a substituted or unsubstituted aniline-containing polymer.

15. The element of claim 1 wherein the layer containing the conductive polymer contains 10 to 1000 mg/m² dry coating weight of the conductive polymer.

16. The element of claim 1 wherein the layer containing the conductive polymer contains 20 to 500 mg/m² dry coating weight of the conductive polymer.

17. The element of claim 1 wherein the layer containing the conductive polymer comprises a mixture containing:
   a) a polythiophene according to Formula I;

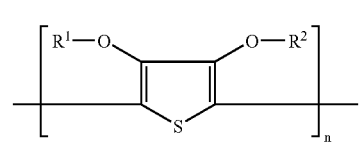

wherein each of $R^1$ and $R^2$ independently represents hydrogen or a C1–C4 alkyl group or together represent an optionally substituted C1–C4 alkylene group or a cycloalkylene group, an optionally alkyl-substituted methylene group, an optionally C1–C12 alkyl- or phenyl-substituted 1,2-ethylene group, a 1,3-propylene group or a 1,2-cyclohexylene group and n is 5–1000;
   b) a polyanion compound; and, optionally
   c) a film forming polymeric binder.

18. The element of claim 17 wherein the polyanion is an anion of a polymeric carboxylic acid.

19. The element of claim 17 wherein the polyanion is a polyacrylic acid, a poly(methacrylic acid), a poly(maleic acid), or a polymeric sulfonic acid.

20. The element of claim 17 wherein the polyanion is a polystyrenesulfonic acid or a polyvinylsulfonic acid.

21. The element of claim 17 wherein the film-forming polymeric binder, is present and comprises from 5 to 95 wt% of the layer containing the conductive polymer.

22. The element of claim 17 wherein the film-forming polymeric binder, is present and is selected from the group consisting of water-soluble or water-dispersible hydrophilic polymers, maleic acid or maleic anhydride copolymers, cellulose derivatives, polyvinyl alcohol, and poly-N-vinylpyrrolidone.

23. The element of claim 17 wherein the film-forming polymeric binder is present and comprises gelatin or gelatin derivatives.

24. The element of claim 17 wherein the film-forming polymeric binder is present and is selected from the group consisting of carboxymethyl cellulose, hydroxyethyl cellulose, cellulose acetate butyrate, diacetyl cellulose, and triacetyl cellulose.

25. The element of claim 17 wherein the film-forming polymeric binder is present and comprises an aqueous emulsion of addition-type homopolymers and copolymers prepared from ethylenically unsaturated monomers.

26. The element of claim 25 wherein the monomers are selected from the group consisting of acrylates, methacrylates, acrylamides, methacrylamides, itaconic acid and its half-esters and diesters, substituted and unsubstituted styrenes, acrylonitrile, methacrylonitrile, vinyl acetates, vinyl ethers, vinyl and vinylidene halides, and olefins.

27. The element of claim 17 wherein the film-forming polymeric binder is present and comprises an aqueous dispersion of polyurethanes or polyesterionomers.

28. The element of claim 17 on which an electrode pattern is made by offset printing, screen-printing or ink-jet printing and wherein the polymeric binder is present.

29. The element of claim 17 wherein said polyanion is polystyrene sulfonic acid.

30. The element of claim 1 wherein the conductive layer is applied using spin coating, hopper coating, roller coating, or air knife coating.

31. The element of claim 1 wherein the support is transparent, opaque, or reflective.

32. The element of claim 1 wherein the support is glass, a polymeric film, paper, silicon wafers, or glass reinforced epoxy.

33. The element of claim 32 wherein the polymeric film support is polyester, polycarbonate, polystyrene, cellulose esters, or polyolefins.

* * * * *